US012803559B2

(12) United States Patent
Nagulapalli et al.

(10) Patent No.: US 12,803,559 B2
(45) Date of Patent: Nov. 17, 2026

(54) COMPACT AND HIGH-SPEED OCTAL CLOCK PHASE GENERATOR FOR PHASE INTERPOLATOR APPLICATIONS

(71) Applicant: ANALOG DEVICES, INC., Wilmington, MA (US)

(72) Inventors: Rajasekhar Nagulapalli, Wilmington, MA (US); Narendra M. K. Rao, Wilmington, MA (US)

(73) Assignee: Analog Devices, Inc., Wilmington, MA (US)

( * ) Notice: Subject to any disclaimer, the term of this patent is extended or adjusted under 35 U.S.C. 154(b) by 106 days.

(21) Appl. No.: 18/428,447

(22) Filed: Jan. 31, 2024

(65) Prior Publication Data

US 2024/0313784 A1 Sep. 19, 2024

Related U.S. Application Data

(60) Provisional application No. 63/453,082, filed on Mar. 18, 2023.

(51) Int. Cl.
*H03L 7/081* (2006.01)
*H03K 19/017* (2006.01)
*H03K 19/20* (2006.01)

(52) U.S. Cl.
CPC ..... *H03L 7/0814* (2013.01); *H03K 19/01742* (2013.01); *H03K 19/20* (2013.01)

(58) Field of Classification Search
None
See application file for complete search history.

(56) References Cited

U.S. PATENT DOCUMENTS 9,876,489 B1 * 1/2018 Casey ...................... H03K 5/05
11,411,555 B2 * 8/2022 Lim ..................... H03K 5/1565

* cited by examiner

*Primary Examiner* — Cassandra F Cox
(74) *Attorney, Agent, or Firm* — Schwegman Lundberg & Woessner, P.A.

(57) ABSTRACT

Described herein are multi-phase clock generator embodiments for compact octal phase generation for high speed clock. A multi-phase clock generator may comprise an in-phase and quadrature (IQ) clock generator that outputs an intermediate clock signal with quad phases and an octal phase generator that generates an output clock signal comprising one or more octal phases and having a clock frequency same as an input 2-phase clock signal to the multi-phase clock generator. The multi-phase clock generator may incorporate a pull-down circuit and a current bias circuit, which may function to improve phase interpolation linearity of the octal phase generator. Histogram of phase shift error comparison shows significant improvement of a multi-phase clock generator embodiment over conventional phase interpolation.

19 Claims, 8 Drawing Sheets

400

200

500

600

700

Phase error histogram of a conventional circuit

Phase error histogram of a proposed circuit embodiment

800

COMPACT AND HIGH-SPEED OCTAL CLOCK PHASE GENERATOR FOR PHASE INTERPOLATOR APPLICATIONS

CROSS-REFERENCE TO RELATED APPLICATION

This application claims the priority benefit under 35 USC § 119(e) to U.S. Provisional Patent Application No. 63/453,082, filed on Mar. 18, 2023, entitled "COMPACT AND HIGH-SPEED OCTAL CLOCK PHASE GENERATOR FOR PHASE INTERPOLATOR APPLICATIONS" and listing Rajasekhar Nagulapalli and Narendra M. K. Rao as inventors. The aforementioned patent document is incorporated by reference herein in its entirety.

TECHNICAL FIELD

The present disclosure relates generally to clock phase generators, and more specifically to octal clock phase generators.

BACKGROUND OF THE INVENTION

Clock generators are widely used in various applications to produce a clock signal for operation synchronizing in a circuit. High loss channel based serializer/deserializer (SerDes) requires aggressive digital equalization, which mandates analog-to-digital (ADC) based receiver. Moderate-speed ADC requires time interleaving technique to relax the track and hold (T&H) and comparator bandwidth requirement. For ADC applications, octal or $16^{th}$ phase generation is more desirable. Digital clock and data recovery (CDR) requires phase interpolator to generate fine phase resolution, which relies on the availability of clock phases with either 90° or 45° phase separation.

Traditionally, 2-phase high-speed clock is output from a clock multiplication unit, e.g., a phase lock loop (PLL). Afterward, four clock phases with 90° phase shift may be generated by a quadrature clock phase generator using a frequency divider. However, such an implementation requires a 2× input clock frequency, and thus increases overall system complexity and cost, especially when a high-speed clock with octal phases is needed.

Accordingly, it would be desirable to have solutions of compact octal phase generation for high-speed clock.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

Figure 1:
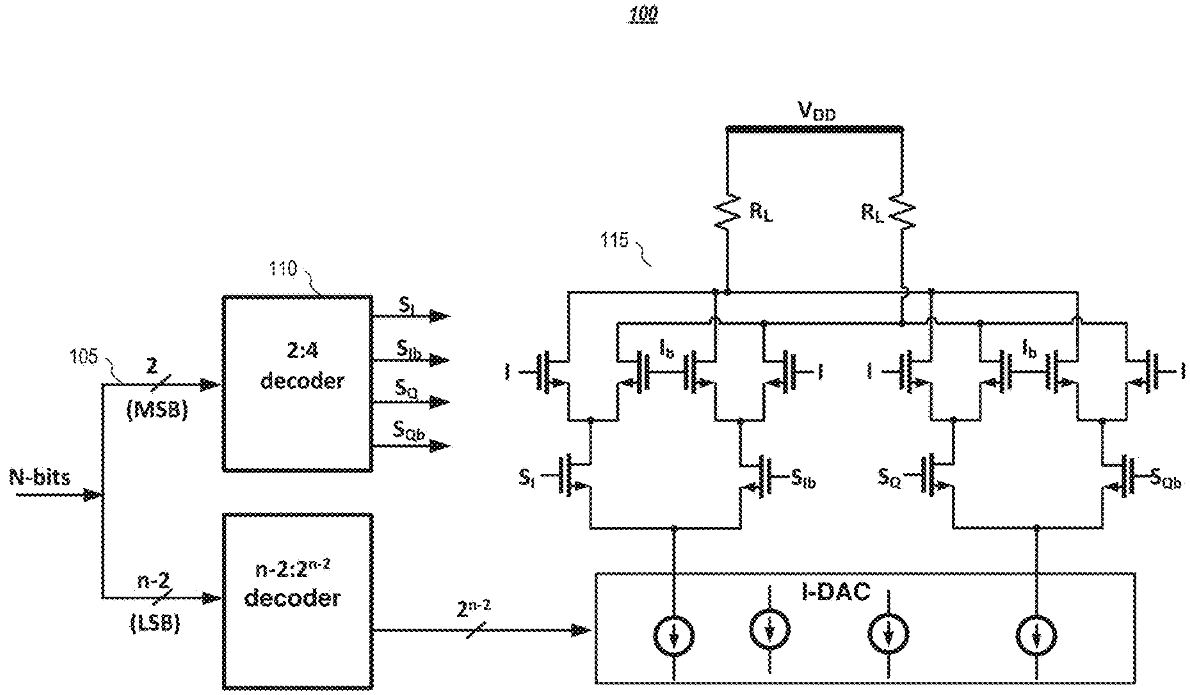
FIG. 1 depicts a conventional phase interpolator using quadrature clocks as inputs to generate multiple phases in a clock cycle.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended to mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Furthermore, connections between components or systems within the figures are not intended to be limited to direct connections. Rather, data or signal between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

One skilled in the art shall recognize that: (1) certain steps may optionally be performed; (2) steps may not be limited to the specific order set forth herein; (3) certain steps may be performed in different orders; and (4) certain steps may be done concurrently.

Clock generators are widely used in various applications to produce a clock signal in synchronizing a circuit's operation. High loss channel based serializer/deserializer (SerDes) requires aggressive digital equalization, which mandates analog-to-digital (ADC) based receiver. Moderate-speed ADC requires time interleaving technique to relax the track and hold (T&H) and comparator bandwidth requirement. For ADC applications, octal or 16$^{th}$ phase generation is more desirable. Digital clock and data recovery (CDR) requires a phase interpolator to generate fine phase resolution, which relies on the availability of clock phases with either 90° or 45° phase-separation.

FIG. 1 depicts a conventional phase interpolator using quadrature clocks as inputs to generate multiple phases in a clock cycle. A 2-phase clock 105 is fed into a 2:4 decoder 110 to generate four clock phases with 90° phase shift, $S_I$ (0°), $S_{Ib}$ (180°), $S_Q$ (90°), $S_{Qb}$ (270°). The 2-phase high-speed clock 105 may be output from a clock multiplication unit, e.g., a phase lock loop (PLL). The decoder 110 may be generated by a quadrature clock phase generator using a frequency divider. The phase interpolator 115 uses the quadrature clocks as inputs to generate multiple phases, e.g., 64 phases, in a clock cycle.

Figure 2:
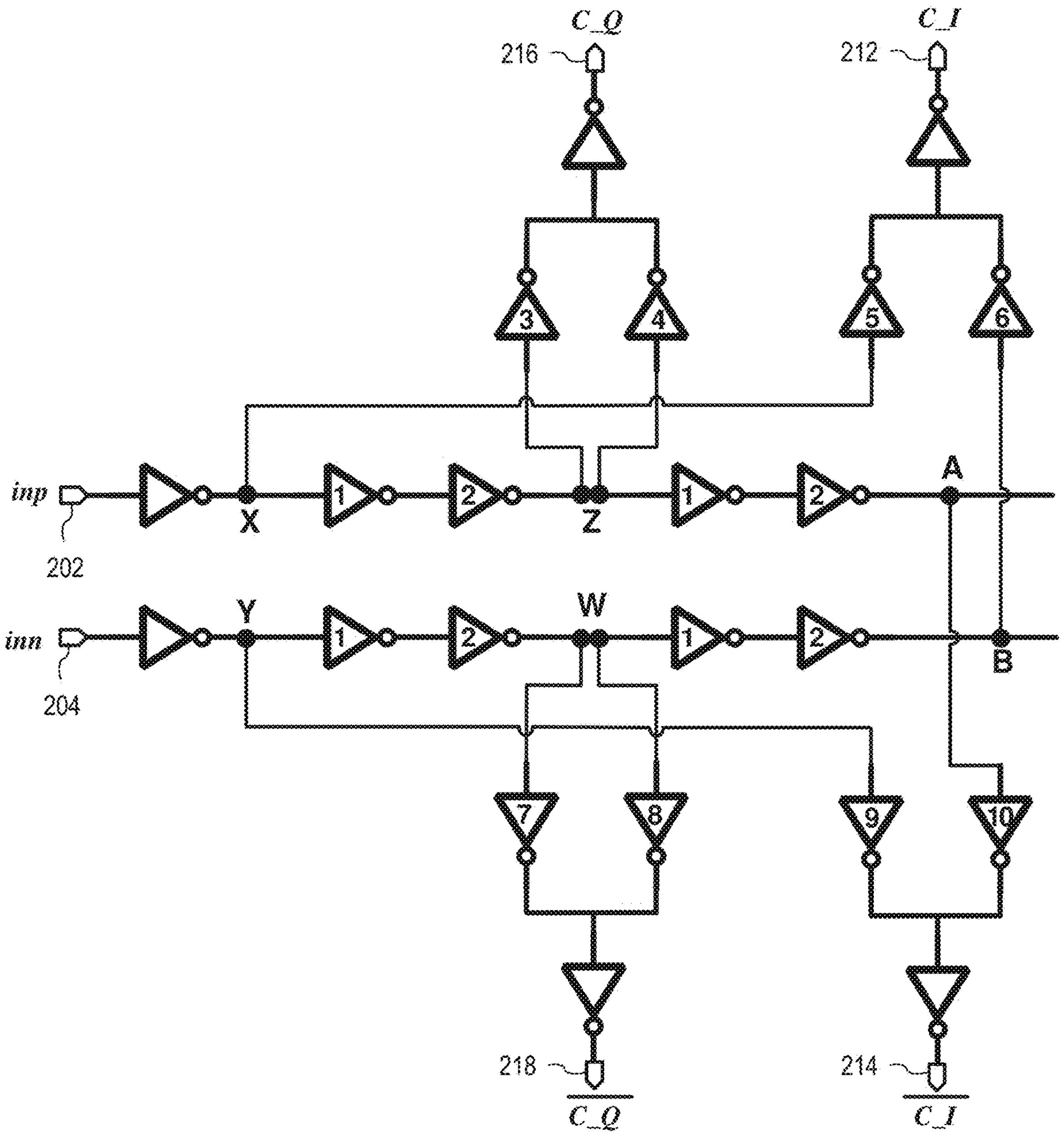
FIG. 2 depicts a schematic for conventional in-phase and quadrature (IQ) generation.

FIG. 2 depicts a schematic for a conventional quadrature generator for in-phase and quadrature (IQ) generation. The quadrature generator 200 receives a 2-phase input clock comprising a first phase input 202 (also referred to as inp or positive phase) and a second phase input 204 (also referred to as inn, which is an opposite phase of the first phase input 202). The quadrature generator 200 comprises multiple logic gates, such as NOT gates, to generate an output clock comprising quad phases, e.g., an in-phase 212, a reverse phase 214 having a 180° phase shift of the in-phase 212, a quadrature phase 216 having a 90° phase shift of the in-phase 212, and a reverse-quadrature phase 218 having a 270° phase shift of the in-phase 212.

A clock signal having four phases with 90° phase shift may be generated by a quadrature clock phase generator using a frequency divider. However, such an implementation requires a 2× input clock frequency. When a high-speed clock with octal phases is needed, such a 2× input clock frequency may be challenging or costly to achieve.

In certain applications, a phase interpolator (PI) requires clocks with either 90° phase separation or 450 phase separation. PI performance may be quantified by the integral non-linearity (INL) and differential non linearity (DNL). A small phase shift from an input clock may improve characteristics. Therefore, a PI with 450 clock phase separation has better DNL. Such a PI with 450 clock phase separation is also called an octal phase PI. A circuit to generate 450 clock phase separation needs careful design such that harmonics, especially 2$^{nd}$ harmonic, may be rejected. For example, with matching rise and fall edge rates, phase noise may be degraded.

Figure 3:
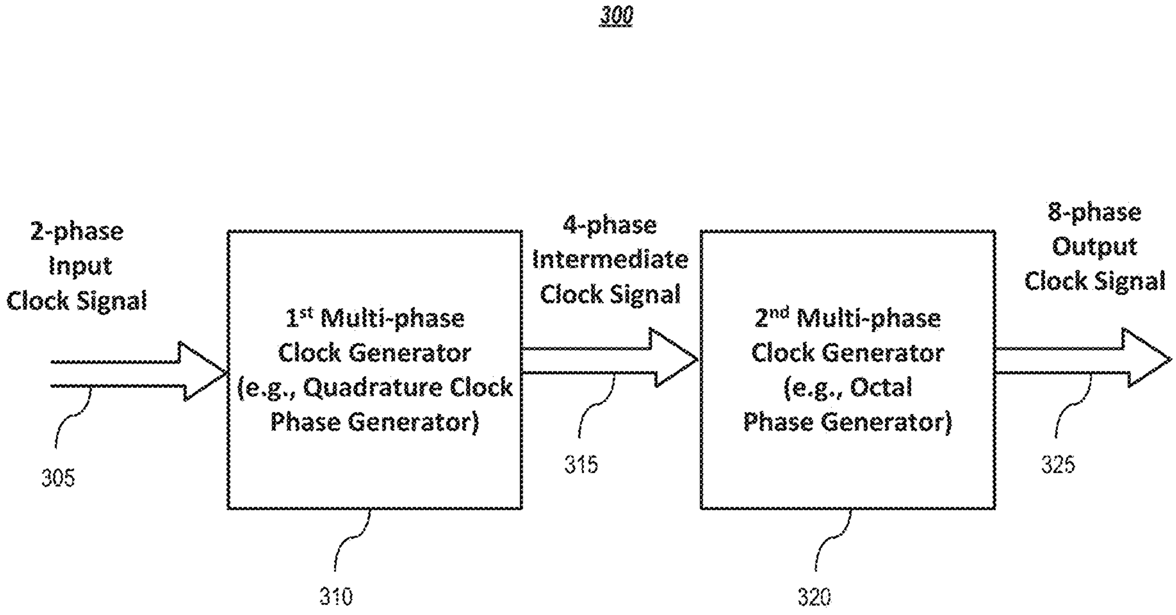
FIG. 3 depicts a block diagram for multi-phase clock generation according to one or more embodiments of the invention.

FIG. 3 depicts a block diagram for multi-phase clock generation according to one or more embodiments of the invention. A first multi-phase generator 310, e.g., a quadrature clock phase generator, receives an input clock signal 305 and generates an intermediate clock signal 315. The input clock signal 305 may be a 2-phase clock signal having two phases and the intermediate clock signal 315 may be a multi-phase clock signal having four clock phases with 90° phase separation. The intermediate clock signal 315 may also be a clock signal comprising one or more quad phases, e.g., 90°, 180°, 270°, etc. A second multi-phase generator 320, e.g., an octal phase generator, receives the intermediate clock signal 315 and generates an output clock signal 325, which may be an octal clock signal having eight clock phases with 450 phase separation. Alternatively, the output clock signal 315 may be a clock signal comprising one or more octal phases, e.g., 45°, 135°, 225°, etc.

Figure 4:
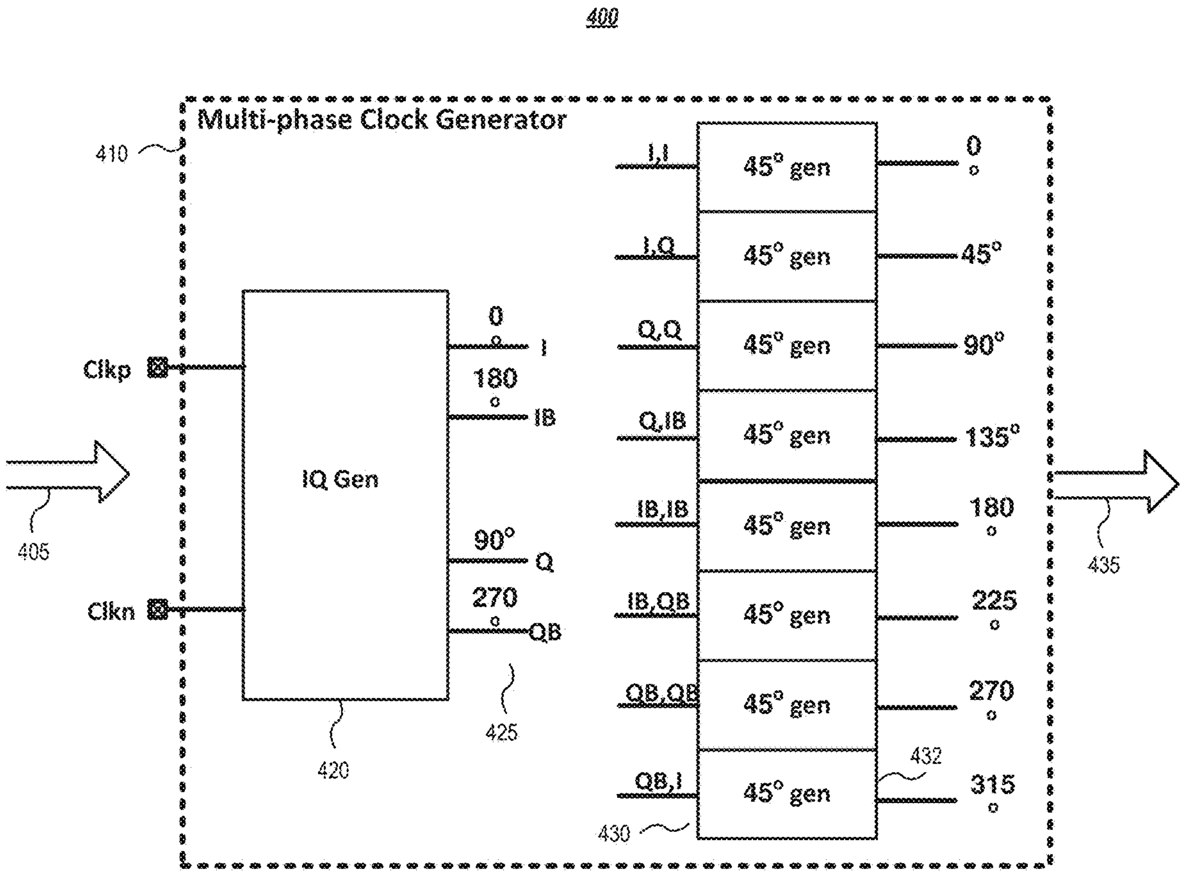
FIG. 4 depicts a schematic for a multi-phase clock generator according to one or more embodiments of the invention.

FIG. 4 depicts a schematic for a multi-phase clock generator according to one or more embodiments of the invention. The multi-phase clock generator comprises an in-phase and quadrature (IQ) clock generator 420 and an octal phase generator 430. The IQ clock generator 420 receives a 2-phase clock signal 405 having two opposite clock phases (Clkp and Clkn) and generates an intermediate clock signal 425 comprising one or more quad phases, e.g., an in-phase (I) with 0° phase shift, a reverse phase (IB) having a 1800 phase shift, a quadrature phase (Q) having a 90° phase shift of the in-phase, a reverse-quadrature phase (QB) having a 2700 phase shift of the in-phase. The octal phase generator 430 may comprise one or more octal phase units 432 to generate an output clock signal 435 comprising one or more octal phases, e.g., 45°, 135°, 225°, etc. In one or more embodiments, the octal phase generator 430 may comprise eight octal phase generation units 432 with each octal phase generation unit receiving a pair of quad phases to generate a corresponding octal phase which is an average of the pair of quad phases. For example, when one octal phase generation unit 432 receives the in-phase (I) and the quadrature phase (Q), an octal phase of 45°, an average of 0° and 90°, is output from the octal phase generation unit 432.

Alternatively, the octal phase generator 430 may comprise one octal phase unit 432, which receives a desired pair of quad phases to generate an output clock signal having a desired octal phase. In one or more embodiments, the octal phase generator 430 may comprise one octal phase unit 432, which may sequentially receive different pairs of quad phases to sequentially generate an output clock signal having different octal phases. The sequence of octal phases may be from lowest phase shift to highest phase shift, from highest phase shift to lowest shift, or in a predetermined order. The sequence of octal phases may be programmed to skip one or more octal phases.

Figure 5:
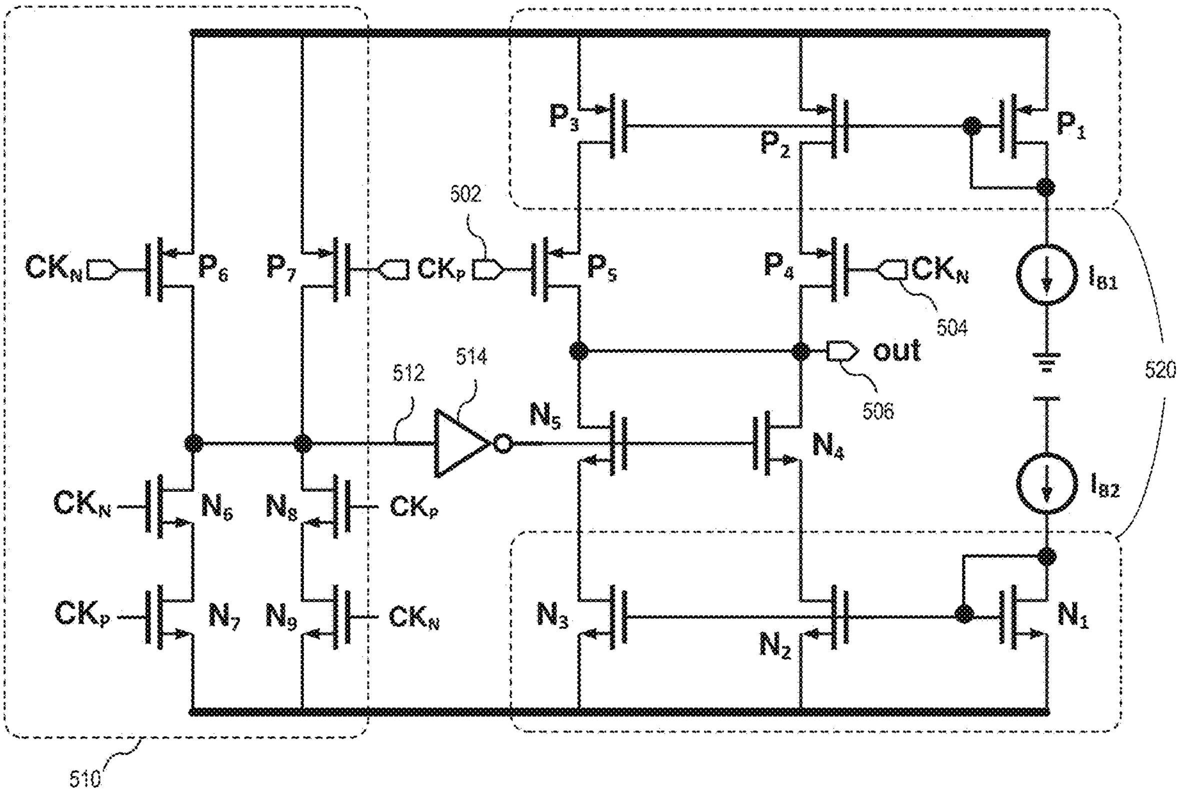
FIG. 5 depicts an octal phase generation unit according to one or more embodiments of the invention.

FIG. 5 depicts an octal phase generation unit according to one or more embodiments of the invention. The octal phase generation unit 500 comprises a first logic gate branch, which comprises a P-channel metal-oxide-semiconductor (PMOS) transistor $P_5$ (also referred to as a first branch PMOS transistor) and an N-channel metal-oxide-semiconductor (NMOS) transistor $N_5$ (also referred to as a first branch NMOS transistor), and a second logic gate branch comprising a PMOS transistor $P_4$ (also referred to as a second branch PMOS transistor) and an NMOS transistor $N_4$ (also referred to as a second branch NMOS transistor). The PMOS transistors $P_4$ and $P_5$ receive, on their gate terminals, two phases of an input clock, named as $CK_N$ 504 and $CK_P$ 502, respectively. The first logic gate branch and the second logic gate branch are bridged, via a connection of drain terminals of transistors $P_4$ and $P_5$ as shown in FIG. 5, to generate an output signal 506. For example, the $CK_N$504 may be an in-phase (I) with 0° phase shift, and the $CK_P$ 502 may be a quadrature phase (Q) having a 90° phase shift. The two phases of an input clock are mixed in the octal phase generation unit 500 to generate the output signal 506, which has an average phase shift of the two phases.

Figure 6:
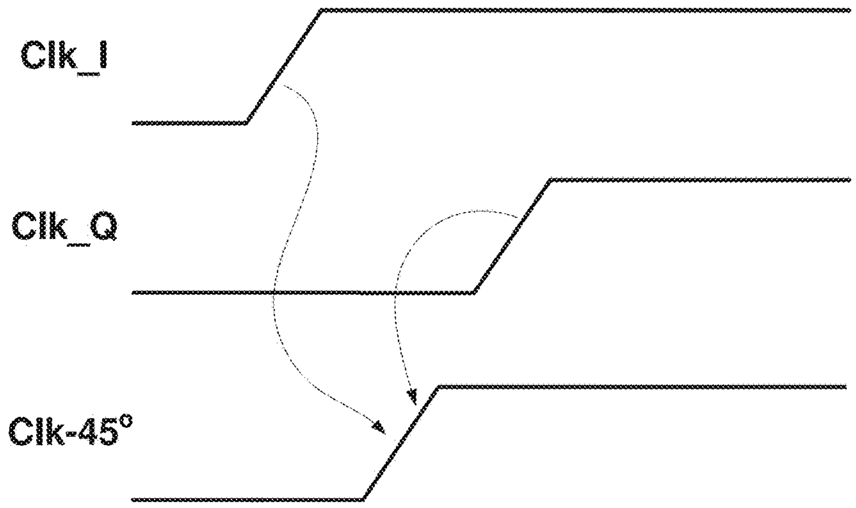
FIG. 6 graphically depicts a principle of octal phase generator according to one or more embodiments of the invention.

FIG. 6 graphically depicts a principle of octal phase generator according to one or more embodiments of the invention. Given a first input clock phase Clk_I, which is an in-phase (I) with 0° phase shift, a second input clock phase Clk_Q, which is a quadrature phase (Q) with 90° phase shift, an output phase Clk_45° is generated as an average of the in-phase and the quadrature phase.

In conventional phase interpolation circuits, there may be significant leakage due to a short circuit current resulting from overlaps of the $CK_N$ 504 and $CK_P$ 502. The short circuit current can introduce non-linearity in a phase interpolation output. In one or more embodiments, to avoid or limit the non-linearity, the octal phase generation unit 500 further comprises a pull-down circuit 510 comprising a plurality of transistors. As shown in FIG. 5, a PMOS transistor $P_6$, an NMOS transistor $N_6$, and an NMOS transistor $N_7$ form a first pull-down branch; a PMOS transistor $P_7$, an NMOS transistor $N_8$, and an NMOS transistor $N_9$ form a second pull-down branch. The two pull-down branches are bridged, with drain terminals of the PMOS transistors $P_6$ and $P_7$ connected as shown in FIG. 5, to output a pull-down signal 512, via an inverter or NOT gate 514, to the gates of the NMOS transistor $N_4$ and the NMOS transistor $N_5$. When the phase interpolation or phase averaging is over, the pull-down signal 512 pulls down the gates of the NMOS transistor $N_4$ and the NMOS transistor $N_5$ to a low potential and thus switching off the two NMOS transistors.

The NMOS transistors $N_6$ and $N_7$ of the first pull-down branch receive, at the gate terminals, the input phases $CK_N$504 and $CK_P$ 502, respectively. The NMOS transistors $N_8$ and $N_9$ of the second pull-down branch receive, at the gates terminals, the input phases $CK_P$ 502 and $CK_N$ 504 respectively, in a manner opposite from the first pull-down branch such that a balanced pull-down circuit configuration may be formed for improved performance. With a combination logic introduced by transistors $P_6$, $P_7$, and $N_6$~$N_9$ in the pull-down circuit 510, the transistors $N_4$ and $N_5$ may be triggered or switched off after phase interpolation completion, instead of after clock cycle completion, such that the non-linearity introduced by short-circuit current may be avoided. In other words, the pull-down circuit 510 may function as a phase interpolation window detector, which triggers the transistors $N_4$ and $N_5$ when the phase interpolation is over to block any non-linear circuit flow in the octal phase generation unit 500.

In one or more embodiments, the octal phase generation unit 500 may further comprise a current bias circuit 520, which comprises PMOS transistors $P_1$~$P_3$ and NMOS transistors $N_1$~$N_3$, to improve the phase interpolation linearity. The PMOS transistors $P_1$~$P_3$ are coupled between the PMOS transistors $P_4$~$P_5$ and a first bias source $I_{B1}$. The NMOS transistors $N_1$~$N_3$ are coupled between the NMOS transistors $N_4$~$N_5$ and a second bias source $I_{B2}$. The PMOS transistors $P_1$~$P_3$ form a PMOS current mirror and the NMOS transistors $N_1$~$N_3$ form an NMOS current mirror to bias the octal phase generation unit 500 and provide at least a minimum current limitation defined by a bandwidth limitation of CMOS clock buffers, which is used to invert an input high-speed clock signal.

Figure 7:
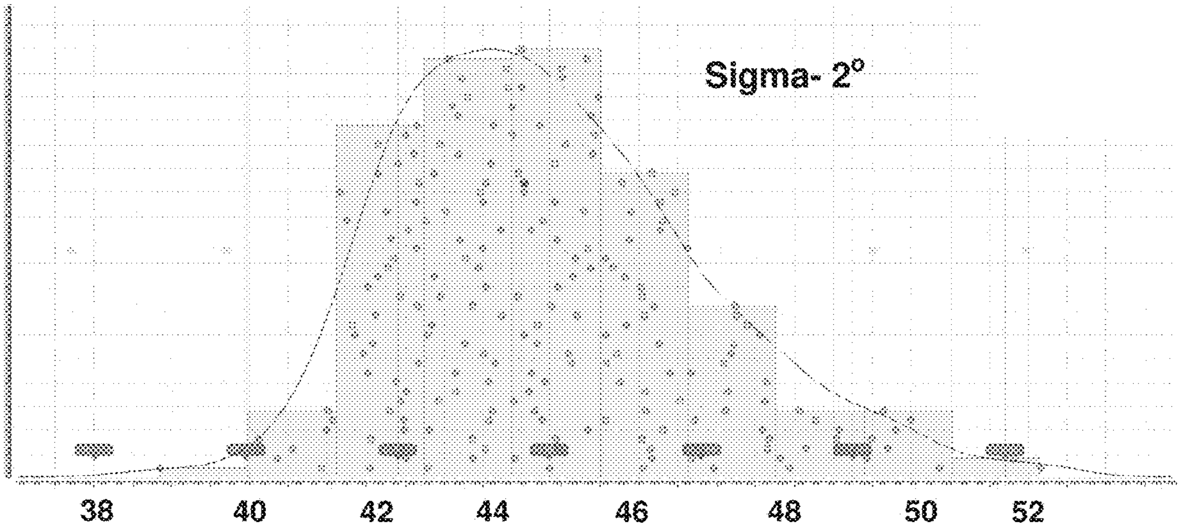
FIG. 7 depicts histograms of phase shift error of a conventional circuit and a multi-phase clock generator embodiment.
Figure 7:
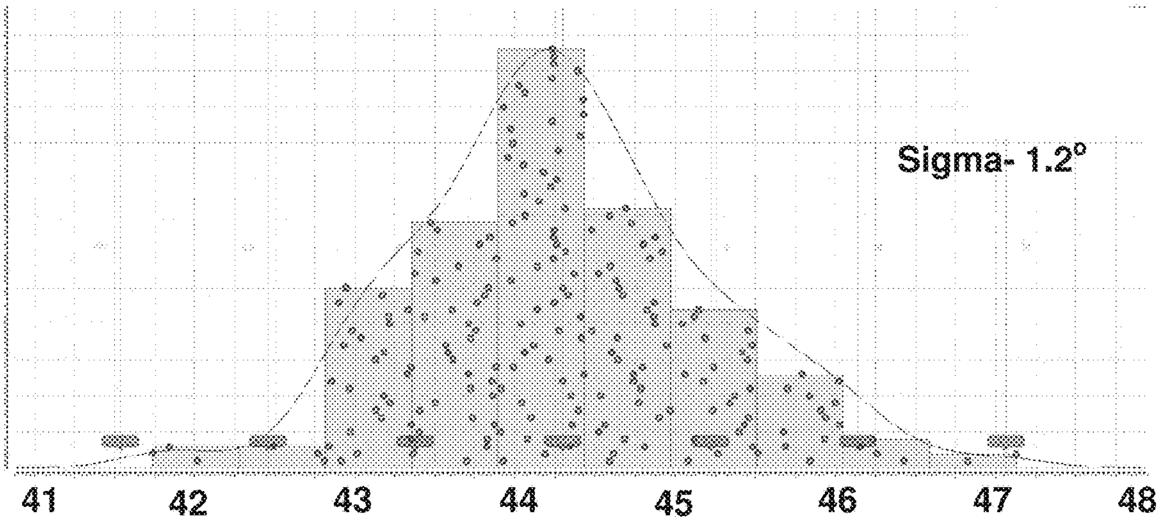

FIG. 7 depicts histograms of phase shift error of a conventional circuit and a multi-phase clock generator embodiment. As shown in FIG. 7, for a desired 45° phase shift output, the conventional circuit has phase error sigma of 2°, while the multi-phase clock generator embodiment has only 1.2°, a significant improvement of 0.8° of error. Such an improvement may be attributed to the pull-down circuit, the current bias circuit, or a combination of both.

Figure 8:
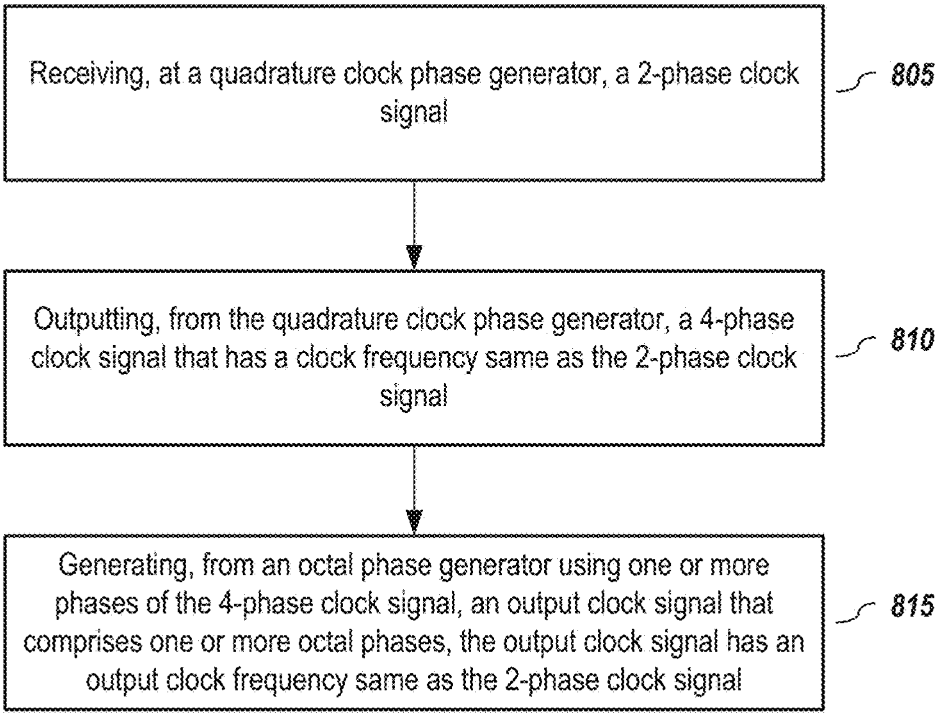
FIG. 8 depicts a process for multi-phase clock generation according to one or more embodiments of the invention.

FIG. 8 depicts a process for multi-phase clock generation according to one or more embodiments of the invention. In step 805, a 2-phase clock signal is received at a quadrature clock phase generator, which may be a flip-flop based quadrature clock generator. In step 810, the quadrature clock phase generator outputs a 4-phase clock signal that has a clock frequency the same as the 2-phase clock signal and has a 90° phase separation. In step 815, a multi-phase generator, such as an octal phase generator, uses one or more phases of the 4-phase clock signal to generate an output clock signal that comprises one or more octal phases. The output clock signal has an output clock frequency the same as the 2-phase clock signal.

Although some embodiments disclosed above are for clock signals with octal phases, one skilled in the art shall understand that one or more embodiments may be applicable to multi-phase clock with different phase shifts. For example, a 22.5° clock phase separation may be achieved using combinations of octal phase clocks, in a similar implementation as generating octal phases using quad-phase clocks.

The foregoing description of the invention has been described for purposes of clarity and understanding. It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A multi-phase clock generator comprising:

a quad-phase clock generator that receives a 2-phase clock signal having two opposite clock phases and generates an intermediate clock signal comprising one or more quad phases; and an octal phase generator that receives the intermediate clock signal to generate an output clock signal comprising one or more octal phases, the octal phase generator comprising one or more octal phase units, with each octal phase unit comprising a first logic gate branch and a second logic gate branch respectively configured to receive a first quad phase and a second quad phase of the intermediate clock signal, wherein the first logic gate branch and the second logic gate branch are bridged to generate an octal phase that has a phase shift that is an average of the first and second quad phases.

2. The multi-phase clock generator of claim 1, wherein:

the first logic gate branch comprises a first branch P-channel metal-oxide-semiconductor (PMOS) transistor and a first branch N-channel metal-oxide-semiconductor (NMOS) transistor; and the second logic gate branch comprises a second branch PMOS transistor and a second branch NMOS transistor;

wherein the first branch PMOS transistor and the second branch PMOS transistor receive, at respective gate terminals, the first and second quad phases of the intermediate clock signal.

3. The multi-phase clock generator of claim 2, wherein each octal phase unit further comprises a pull-down circuit coupled to the first branch NMOS transistor and the second branch NMOS transistor, the pull-down circuit configured to output a pull-down signal to switch off the first branch NMOS transistor and the second branch NMOS transistor when each octal phase unit finishes a phase interpolation.

4. The multi-phase clock generator of claim 3, wherein the pull-down circuit comprises:

a first pull-down branch comprising two NMOS transistors configured to receive, at gate terminals thereof, the first and second quad phases, respectively; and a second pull-down branch comprising two NMOS transistors configured to receive, at gate terminals thereof, the first and second quad phases, respectively, in a manner opposite from the first pull-down branch;

wherein the first and second pull-down branches are bridged to output the pull-down signal.

5. The multi-phase clock generator of claim 4, wherein the pull-down circuit comprises an inverter or NOT gate configured to output the pull-down signal to the gate terminals of the first branch NMOS transistor and the second branch NMOS transistor.

6. The multi-phase clock generator of claim 4, wherein:

the first pull-down branch further comprises a first pull-down PMOS transistor; and the second pull-down branch further comprises a second pull-down PMOS transistor;

wherein the first pull-down PMOS transistor and the second pull-down PMOS transistor receive, at gate terminals respectively, the first and second, or second and first, quad phases of the intermediate clock signal.

7. The multi-phase clock generator of claim 1, wherein each octal phase unit further comprises a current bias circuit that comprises multiple PMOS transistors coupled to a first bias source and multiple NMOS transistors, the multiple PMOS transistors coupled between a first bias source and the first and the second logic gate branches, the multiple NMOS transistors coupled between a second bias source and the first and the second logic gate branches.

8. A phase generator comprising:

a first logic gate branch comprising a pair of first branch transistors, the first logic gate branch configured to receive a first input clock signal having a first phase; and a second logic gate branch comprising a pair of second branch transistors, the second logic gate branch configured to receive a second input clock signal having a second phase, the second input clock signal having a clock frequency the same as the first input clock signal;

wherein the first logic gate branch and the second logic gate branch are bridged to generate an output signal that has a phase shift as an average of the first phase and the second phase;

wherein the first input clock signal and the second input clock signal are respective quad phase signals, and the output signal is an octal phase signal.

9. The phase generator of claim 8, wherein:

the pair of first branch transistors comprises a first branch P-channel metal-oxide semiconductor (PMOS) transistor and a first branch N-channel metal-oxide-semiconductor (NMOS) transistor, the first logic gate branch configured to receive the first input clock signal at a gate terminal of the first branch PMOS transistor;

the pair of second branch transistors comprises a second branch PMOS transistor and a second branch NMOS transistor, the second logic gate branch configured to receive the second input clock signal at a gate terminal of the second branch PMOS transistor;

wherein the first logic gate branch and the second logic gate branch are bridged with drain terminals of the first branch PMOS transistor and the second branch PMOS transistor connected.

10. The phase generator of claim 9 further comprising:

a pull-down circuit coupled to the first branch NMOS transistor and the second branch NMOS transistor, the pull-down circuit configured to output a pull-down signal to switch off the first branch NMOS transistor and the second branch NMOS transistor when a phase averaging of the first phase and the second phase is over.

11. The phase generator of claim 10, wherein the pull-down circuit comprises:

a first pull-down branch comprising two NMOS transistors configured to receive, at gate terminals thereof, the first input clock signal and the second input clock signal, respectively; and a second pull-down branch comprising two NMOS transistors configured to receive, at gate terminals thereof, the first input clock signal and the second input clock signal, respectively, and in a manner opposite from the first pull-down branch;

wherein the first and second pull-down branches are bridged to output the pull-down signal via an inverter or NOT gate to the gate terminals of the first branch NMOS transistor and the second branch NMOS transistor.

12. The phase generator of claim 10, wherein:

the first pull-down branch further comprises a first pull-down PMOS transistor; and the second pull-down branch further comprises a second pull-down PMOS transistor;

wherein the first pull-down PMOS transistor and the second pull-down PMOS transistor are configured to receive, at gate terminals respectively, the first and second input clock signals.

13. The phase generator of claim 9 further comprising:

a current bias circuit that comprises multiple PMOS transistors and multiple NMOS transistors, the multiple PMOS transistors coupled between a first bias source and the first and second branch PMOS transistors, the multiple NMOS transistors coupled between a second bias source and the first and second branch NMOS transistors.

14. The phase generator of claim 13, wherein the multiple PMOS transistors have their source terminals connected, and the multiple NMOS transistors have their source terminals connected.

15. A method for clock phase generation, the method comprising:

receiving, at a first logic gate branch comprising a pair of first branch transistors, a first input clock signal having a first phase;

receiving, at a second logic gate branch comprising a pair of second branch transistors, a second input clock signal having a second phase, the second input clock signal having a clock frequency the same as the first input clock signal, wherein the first logic gate branch and the second logic gate branch are bridged via a connection between the first logic gate branch and the second logic gate branch; and outputting, from the connection between the first logic gate branch and the second logic gate branch, an output signal that has a phase shift as an average of the first phase and the second phase;

wherein the first input clock signal and the second input clock signal are respective quad phase signals, and the output signal is an octal phase signal.

16. The method of claim 15, wherein:

the pair of first branch transistors comprises a first branch P-channel metal-oxide-semiconductor (PMOS) transistor and a first branch N-channel metal-oxide-semiconductor (NMOS) transistor, the first logic gate branch receives the first input clock signal at a gate terminal of the first branch PMOS transistor; and the pair of second branch transistors comprises a second branch PMOS transistor and a second branch NMOS transistor, the second logic gate branch receives the second input clock signal at a gate terminal of the second branch PMOS transistor; and the first logic gate branch and the second logic gate branch are bridged with drain terminals of the first branch PMOS transistor and the second branch PMOS transistor connected.

17. The method of claim 16 further comprises:

outputting, from a pull-down circuit, a pull-down signal to switch off the first branch NMOS transistor and the second branch NMOS transistor when a phase averaging of the first phase and the second phase is over.

18. The method of claim 17, wherein the pull-down circuit comprises:

a first pull-down branch comprising two NMOS transistors that receive, at gate terminals thereof, the first input clock signal and the second input clock signal, respectively; and a second pull-down branch comprising two NMOS transistors that receive, at gate terminals thereof, the first input clock signal and the second input clock signal, respectively, and in a manner opposite from the first pull-down branch;

wherein the first and second pull-down branches are bridged to output the pull-down signal.

19. The method of claim 18, wherein:

the first pull-down branch further comprises a first pull-down PMOS transistor;

the second pull-down branch further comprises a second pull-down PMOS transistor; and the first pull-down PMOS transistor and the second pull-down PMOS transistor receive, at gate terminals thereof, the first and second input clock signals, respectively.

* * * * *